(12) United States Patent
Wang et al.

(10) Patent No.: US 9,374,043 B2
(45) Date of Patent: Jun. 21, 2016

(54) DUAL STAGE CARRIER-AGGREGATION (CA) LOW NOISE AMPLIFIER (LNA) HAVING HARMONIC REJECTION AND HIGH LINEARITY

(71) Applicant: QUALCOMM Incorporated, San Diego, CA (US)

(72) Inventors: Chuan Wang, San Diego, CA (US); Dongling Pan, San Diego, CA (US); Yiwu Tang, San Diego, CA (US); Klaas van Zalinge, La Jolla, CA (US); Muhammad Hassan, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 10 days.

(21) Appl. No.: 14/292,216

(22) Filed: May 30, 2014

(65) Prior Publication Data

US 2015/0349722 A1     Dec. 3, 2015

(51) Int. Cl.

| H03F 3/191 | (2006.01) |
|---|---|
| H03F 1/26 | (2006.01) |
| H03F 3/19 | (2006.01) |
| H04B 1/40 | (2015.01) |
| H03F 1/22 | (2006.01) |
| H03F 1/32 | (2006.01) |
| H03F 1/56 | (2006.01) |
| H03F 3/193 | (2006.01) |
| H03F 3/24 | (2006.01) |

(52) U.S. Cl.
CPC .......... *H03F 1/26* (2013.01); *H03F 1/223* (2013.01); *H03F 1/3205* (2013.01); *H03F 1/565* (2013.01); *H03F 3/19* (2013.01); *H03F 3/193* (2013.01); *H03F 3/245* (2013.01); *H04B 1/40* (2013.01); *H03F 2200/111* (2013.01); *H03F 2200/165* (2013.01); *H03F 2200/168* (2013.01); *H03F 2200/171* (2013.01); *H03F 2200/294* (2013.01); *H03F 2200/411* (2013.01); *H03F 2200/451* (2013.01)

(58) Field of Classification Search
CPC .............. H03F 3/191; H03F 2200/301; H03F 2200/306; H03F 2200/06; H03F 2200/09
USPC .................................. 330/301, 302, 306, 311
See application file for complete search history.

(56) References Cited

U.S. PATENT DOCUMENTS

| 4,371,846 | A | * | 2/1983 | Gamble | ......................... 330/278 |
| 7,245,187 | B2 | * | 7/2007 | Khajehpour | .................. 330/305 |
| 7,973,603 | B2 | | 7/2011 | Kammula et al. | |
| 8,145,170 | B2 | | 3/2012 | Khoini-Poorfard et al. | |
| 8,577,325 | B2 | | 11/2013 | Lee et al. | |
| 8,742,851 | B2 | * | 6/2014 | Jahanian | ............... H03F 1/3211 330/286 |

(Continued)

OTHER PUBLICATIONS

International Search Report and Written Opinion—PCT/US2015/032504—ISA/EPO—Aug. 31, 2015.

(Continued)

Primary Examiner — Steven J Mottola
(74) Attorney, Agent, or Firm — Smith Risley Tempel Blaha LLC (57) ABSTRACT

A device includes a load circuit configured to receive an amplified communication signal, the load circuit having a center tapped inductor structure configured to divide the amplified communication signal into a first portion and a second portion, the load circuit configured to resonate at a harmonic of the amplified communication signal.

16 Claims, 8 Drawing Sheets

(56) References Cited

U.S. PATENT DOCUMENTS

| | | | |
|---|---|---|---|
| 2009/0021307 A1 | 1/2009 | Tzeng et al. | |
| 2010/0244963 A1* | 9/2010 | Hsu | H03F 1/56 330/277 |
| 2011/0212692 A1 | 9/2011 | Hahn et al. | |
| 2013/0316671 A1 | 11/2013 | Stockinger et al. | |

OTHER PUBLICATIONS

Lee J., et al., "A Concurrent Tri-Band Low-Noise Amplifier With a Novel Tri-Band Load Resonator Employing Feedback Notches", IEEE Transactions on Microwave Theory and Techniques, IEEE Service Center, Piscataway, NJ, US, vol. 61, No. 12, Dec. 2, 2013, pp. 4195-4208, XP011531994, ISSN: 0018-9480, DOI: 10.1109/TMTT.2013.2288592 [retrieved on Nov. 28, 2013] p. 4195, left-hand column, line 25—p. 4206, left-hand column, line 30; figures 1,5,6,7.

Nguyen C., "Advanced Concurrent-Multiband, Multibeam, Aperture-Synthesis with Intelligent Processing for Urban Operation Sensing", Texas Engineering Experiment Station, AFOSR DTIC report approved for public release, Apr. 9, 2012, pp. 14-23, XP055208755, Retrieved from the Internet: URL: http://www.dtic.mil/get-tr-doc/pdf?AD=ADA582347 [retrieved on Aug. 20, 2015] p. 19, line 1—p. 21, line 14; figures 26,27,29.

\* cited by examiner

DUAL STAGE CARRIER-AGGREGATION (CA) LOW NOISE AMPLIFIER (LNA) HAVING HARMONIC REJECTION AND HIGH LINEARITY

BACKGROUND

1. Field

The present disclosure relates generally to electronics, and more specifically to transmitters and receivers.

2. Background

In a radio frequency (RF) transceiver, a communication signal is typically received and downconverted by receive circuitry, sometimes referred to as a receive chain. A receive chain typically includes a receive filter, a low noise amplifier (LNA), a mixer, a local oscillator (LO), a voltage controlled oscillator (VCO), a baseband filter, and other components, to recover the information contained in the communication signal. The transceiver also includes circuitry that enables the transmission of a communication signal to a receiver in another transceiver. The transceiver may be able to operate over multiple frequency ranges, typically referred to a frequency bands. Moreover, a single transceiver may be configured to operate using multiple carrier signals that may occur in the same frequency band, but that may not overlap in actual frequency, an arrangement referred to as non-contiguous carriers.

In some instances, it is desirable to have a single transmitter or receiver that is configured to operate using multiple transmit frequencies and/or multiple receive frequencies. For a receiver to be able to simultaneously receive two or more receive signals, the concurrent operation of two or more receive paths is required. Such systems are sometimes referred to as "carrier-aggregation" systems. The term "carrier-aggregation" may refer to systems that include inter-band carrier aggregation and intra-band carrier aggregation. Intra-band carrier aggregation refers to the processing of two separate and non-contiguous carrier signals that occur in the same communication band. Currently, even though these non-contiguous carriers may be close together, a separate receive chain is typically needed to process each carrier. When implementing such a carrier aggregation receiver, it is possible that power from one carrier may interfere with the down-conversion of another carrier, causing what is referred to as inter-modulation distortion. Intermodulation distortion occurring as a second-order function is referred to as IM2 and when occurring as a third-order function is referred to as IM3. Intermodulation distortion can lead to desensitizing the receiver, a condition sometimes referred to as "receiver desensitization" or "receiver desense." Receiver desensitization may occur due to the presence of second-order distortion, third-order distortion, and higher-order distortion caused by the operation of the low noise amplifier (LNA) or may occur as a result of an out of band (OOB) jammer signal, such as a WIFI jammer signal or an OOB transmit jammer signal.

WIFI is a term given to a relatively short-range local area network generally complying with IEEE 802.11 protocols, operating in a number of different frequency bands. Modern cellular transceivers need to operate in the presence of WIFI transceivers. Cellular receiver desensitization may occur due to the presence of out-of-band jammers in some or all of the WIFI bands. A WIFI transceiver may operate in a frequency range that may overlap with one or more cellular transceiver frequencies. For example, a WIFI transceiver's frequency range may have transmit energy in the 2.4 GHz range and in the 5.25-5.725 GHz range, which may overlap with the $3^{rd}$ order local oscillator (LO) range of a cellular transceiver operating in low band (LB) B20 (having a downlink frequency between 791 MHz-821 MHz) and a cellular transceiver operating in mid band (MB) B2 (having a downlink frequency between 1930 MHz-1990 MHz) and B3 (having a downlink frequency between 1805 MHz-1880 MHz). In this example, the LO of the cellular receiver will downconvert the desired fundamental signal, along with the WIFI OOB jammer occurring at the 3LO frequency, leading to receiver sensitivity degradation.

Furthermore, if a WIFI jammer occurs in a receiver configured for carrier-aggregation, the WIFI jammer power may be inter-modulated with transmit signal leakage into a receive band, with the result of $2^{nd}$ or $3^{rd}$ order intermodulation products appearing in a receive band.

At low power levels, the fundamental output power of the LNA rises in a one-to-one ratio (in terms of dB) with respect to the input power, the second-order output power rises in a two-to-one ratio, and the third-order output power rises in a three-to-one ratio. If the input power is high enough for the LNA to reach saturation, the output power flattens out in all the first-order, second-order and third-order cases.

The second order intercept point (IIP2) is the output power point at which the extrapolated first- and second-order lines intersect on a plot, since the actual power levels will flatten off due to saturation at a much lower power level typically. The third-order intercept point (IIP3) is the output power point at which the extrapolated first-order and third-order lines intersect on a plot, since the actual power levels will flatten off due to saturation at much lower power level typically.

Further, LNA out-of-band (OOB) IIP2 and IIP3 performance becomes more of a concern when the LNA input matching circuitry moves toward single-element, such as single inductance (L) components, particularly when the single-L matching circuitry is located on a different chip than the LNA. When implementing such a single-L matching circuit, higher order harmonic cancelation becomes more difficult.

Thus, it would be desirable to be able to cancel higher order harmonics and improve receiver out-of-band linearity (IIP2 and IIP3) simultaneously when implementing a single-L matching circuit for a receiver.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

Exemplary embodiments of the disclosure are directed to a harmonic rejection scheme using a load circuit having the ability to reject third-order harmonic signals generated by a low noise amplifier (LNA). In an exemplary embodiment, a two stage main LNA includes a first main amplification stage and a second stage having a highly-linear inverter for each carrier aggregation (CA) path. The output of the first main amplification stage is provided to a load circuit having the ability to reject harmonic signals originating from the out-of-band jammers, like WIFI jammers, which, in an exemplary embodiment, can be $3^{rd}$ order harmonics.

As used herein, the terms "jammer," "jammer signal," "interfering signal," "WIFI jammer," "TX jammer," and "TX jammer signal" refer to any signal received by receive circuitry that desensitizes the receiver, or that interferes with or hinders the reception and recovery of an information signal received in a receiver.

As used herein, the terms "desired signal," "received information signal" "receive signal," and "receiver signal," refer to a communication signal received in a receiver and containing information sought to be recovered by a receiver.

Figure 1:
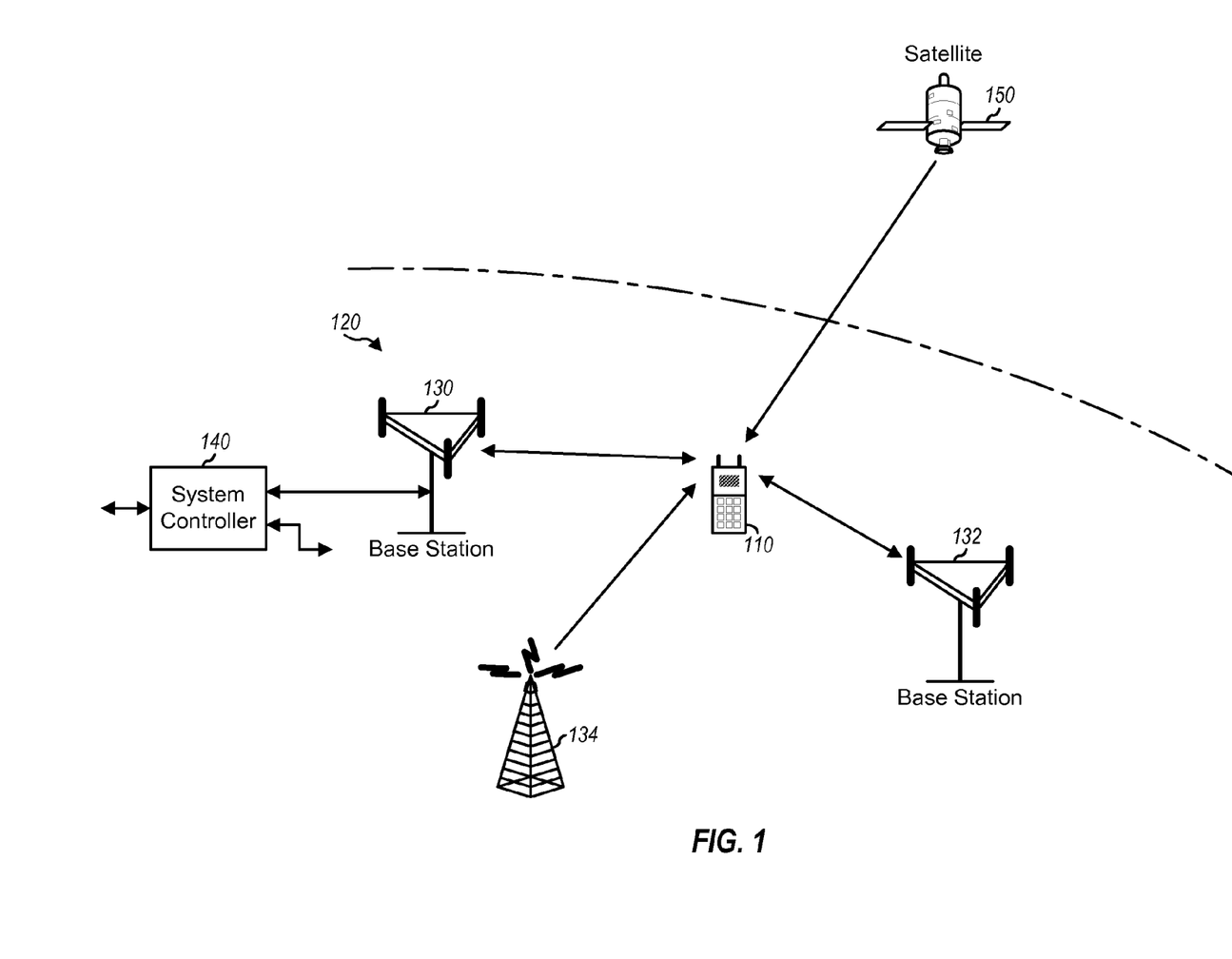
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1×, EVDO, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2A:
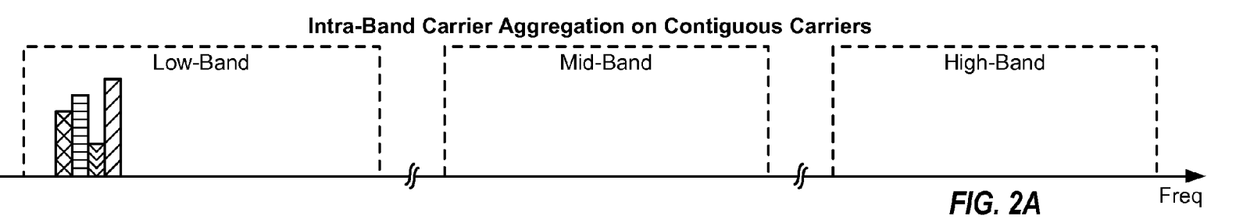
FIG. 2A is a graphical diagram showing an example of contiguous intra-band carrier-aggregation (CA).

FIG. 2A is a graphical diagram showing an example of contiguous intra-band carrier-aggregation (CA). In the example shown in FIG. 2A, wireless device 110 is configured with four contiguous carriers in one band in low-band. Wireless device 110 may send and/or receive transmissions on the four contiguous carriers within the same band.

Figure 2B:
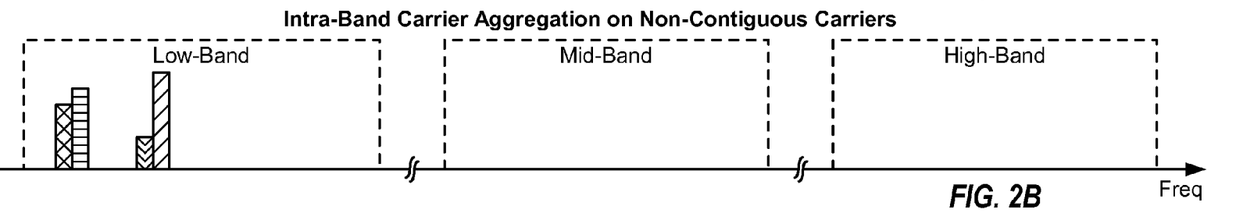
FIG. 2B is a graphical diagram showing an example of non-contiguous intra-band CA.

FIG. 2B is a graphical diagram showing an example of non-contiguous intra-band CA. In the example shown in FIG. 2B, wireless device 110 is configured with four non-contiguous carriers in one band in low-band. The carriers may be separated by 5 MHz, 10 MHz, or some other amount. Wireless device 110 may send and/or receive transmissions on the four non-contiguous carriers within the same band.

Figure 2C:
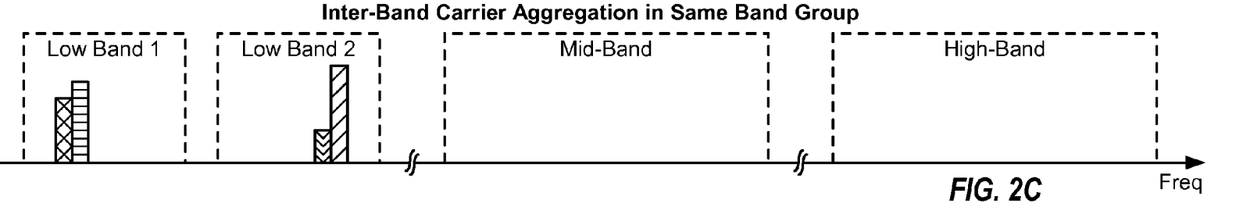
FIG. 2C is a graphical diagram showing an example of inter-band CA in the same band group.

FIG. 2C is a graphical diagram showing an example of inter-band CA in the same band group. In the example shown in FIG. 2C, wireless device 110 is configured with four carriers in two bands in low-band. Wireless device 110 may send and/or receive transmissions on the four carriers in different bands in the same band group.

Figure 2D:
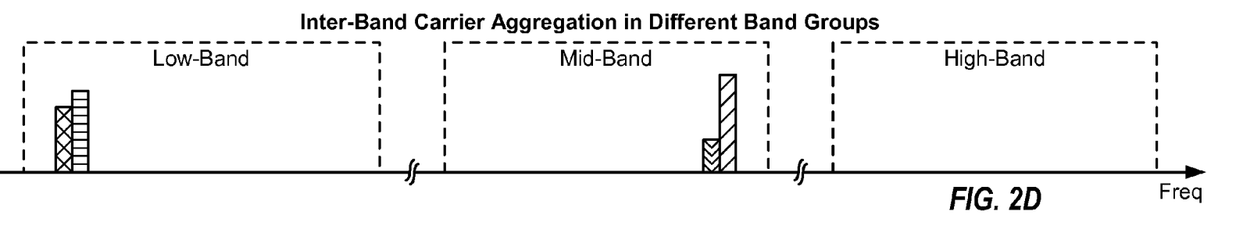
FIG. 2D is a graphical diagram showing an example of inter-band CA in different band groups.

FIG. 2D is a graphical diagram showing an example of inter-band CA in different band groups. In the example shown in FIG. 2D, wireless device 110 is configured with four carriers in two bands in different band groups, which include two carriers in one band in low-band and two carriers in another band in mid-band. Wireless device 110 may send and/or receive transmissions on the four carriers in different bands in different band groups.

FIGS. 2A to 2D show four examples of carrier aggregation. Carrier aggregation may also be supported for other combinations of bands and band groups.

Figure 3:
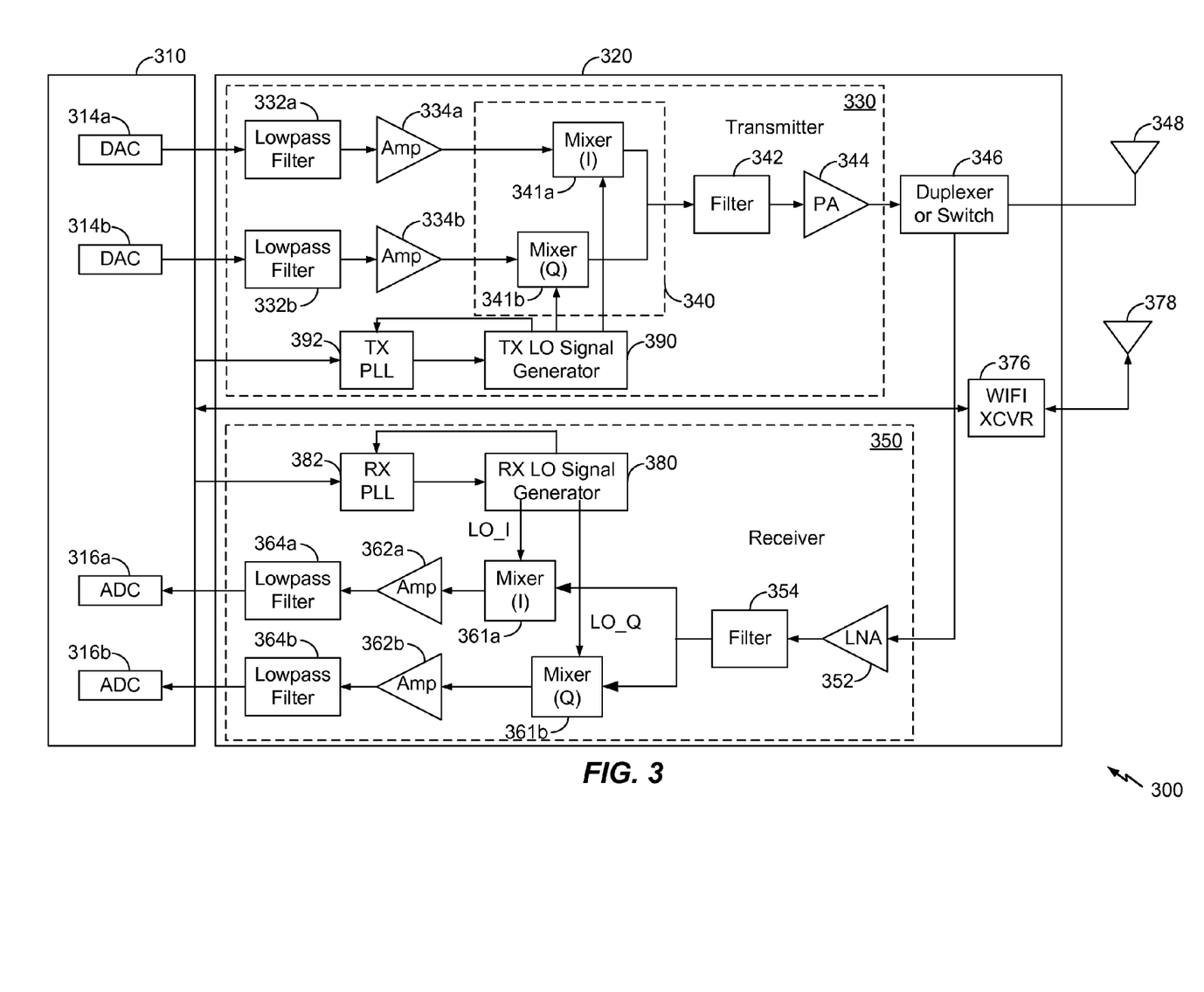
FIG. 3 is a block diagram showing a wireless device in which the exemplary techniques of the present disclosure may be implemented.

FIG. 3 is a block diagram showing a wireless device 300 in which the exemplary techniques of the present disclosure may be implemented. FIG. 3 shows an example of a transceiver 320. In general, the conditioning of the signals in a transmitter 330 and a receiver 350 may be performed by one or more stages of amplifier, filter, upconverter, downconverter, etc. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, wireless device 300 generally comprises a transceiver 320 and a data processor 310. The data processor 310 may include a memory (not shown) to store data and program codes, and may generally comprise analog and digital processing elements. The transceiver 320 includes a transmitter 330 and a receiver 350 that support bi-directional communication. In general, wireless device 300 may include any number of transmitters and/or receivers for any number of communication systems and frequency bands. All or a portion of the transceiver 320 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 3, transmitter 330 and receiver 350 are implemented with the direct-conversion architecture.

In the transmit path, the data processor 310 processes data to be transmitted and provides in-phase (I) and quadrature (Q) analog output signals to the transmitter 330. In an exemplary embodiment, the data processor 310 includes digital-to-analog-converters (DAC's) 314a and 314b for converting digital signals generated by the data processor 310 into the I and Q analog output signals, e.g., I and Q output currents, for further processing.

Within the transmitter 330, lowpass filters 332a and 332b filter the I and Q analog transmit signals, respectively, to remove undesired images caused by the prior digital-to-analog conversion. Amplifiers (Amp) 334a and 334b amplify the signals from lowpass filters 332a and 332b, respectively, and provide I and Q baseband signals. An upconverter 340 upconverts the I and Q baseband signals with I and Q transmit (TX) local oscillator (LO) signals from a TX LO signal generator 390 and provides an upconverted signal. A filter 342 filters the upconverted signal to remove undesired images caused by the frequency upconversion as well as noise in a receive frequency band. A power amplifier (PA) 344 amplifies the signal from filter 342 to obtain the desired output power level and provides a transmit RF signal. The transmit RF signal is routed through a duplexer or switch 346 and transmitted via an antenna 348.

In the receive path, antenna 348 receives communication signals and provides a received RF signal, which is routed through duplexer or switch 346 and provided to a low noise amplifier (LNA) 352. The duplexer 346 is designed to operate with a specific RX-to-TX duplexer frequency separation, such that RX signals are isolated from TX signals. The received RF signal is amplified by LNA 352 and filtered by a filter 354 to obtain a desired RF input signal. Downconversion mixers 361a and 361b mix the output of filter 354 with I and Q receive (RX) LO signals (i.e., LO_I and LO_Q) from an RX LO signal generator 380 to generate I and Q baseband signals. The I and Q baseband signals are amplified by amplifiers 362a and 362b and further filtered by lowpass filters 364a and 364b to obtain I and Q analog input signals, which are provided to data processor 310. In the exemplary embodiment shown, the data processor 310 includes analog-to-digital-converters (ADC's) 316a and 316b for converting the analog input signals into digital signals to be further processed by the data processor 310.

In FIG. 3, TX LO signal generator 390 generates the I and Q TX LO signals used for frequency upconversion, while RX LO signal generator 380 generates the I and Q RX LO signals used for frequency downconversion. Each LO signal is a periodic signal with a particular fundamental frequency. A phase locked loop (PLL) 392 receives timing information from data processor 310 and generates a control signal used to adjust the frequency and/or phase of the TX LO signals from LO signal generator 390. Similarly, a PLL 382 receives timing information from data processor 310 and generates a control signal used to adjust the frequency and/or phase of the RX LO signals from LO signal generator 380.

In an exemplary embodiment, the wireless device 300 may also comprise a WIFI transceiver 376. The WIFI transceiver 376 may be coupled to an antenna 378 and to the data processor 310. In an exemplary embodiment, the WIFI transceiver 376 comprises transmit and receive circuitry configured to communicate over one or more of the WIFI communication bands pursuant to one or more of the IEEE 801.11 protocols. Although shown as having a separate antenna 378, the WIFI transceiver 376 may also be configured to use the antenna 348, in which case, the WIFI transceiver 376 would be coupled to the duplexer or switch 346.

Wireless device 300 may support CA and may (i) receive multiple downlink signals transmitted by one or more cells on multiple downlink carriers at different frequencies and/or (ii) transmit multiple uplink signals to one or more cells on multiple uplink carriers.

In a CA communication environment where multiple receive signals are processed simultaneously, it is possible that a receive signal on a particular receive path can couple to and impair the sensitivity of a receiver operating on a receive signal on a different receive path. Moreover, it is also possible that that a WIFI transmit or receive signal can couple to and impair the sensitivity of a receiver operating on a receive signal on a different receive path.

Figure 4:
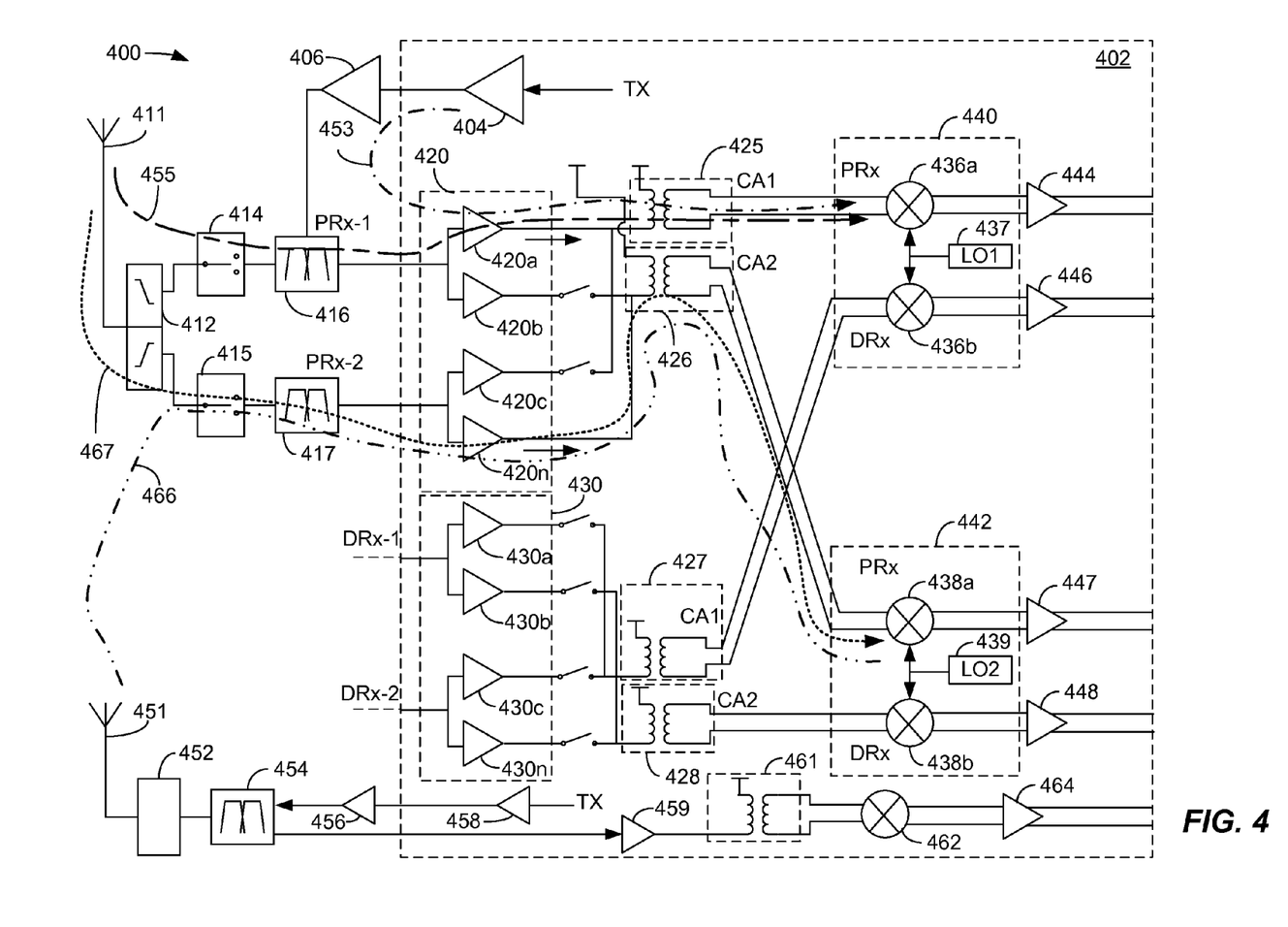
FIG. 4 is a schematic diagram illustrating an exemplary embodiment of a transceiver front-end configured to process multiple communication signals.

FIG. 4 is a schematic diagram illustrating an exemplary embodiment of a transceiver front-end configured to process multiple communication signals. The transceiver front-end 402 is an exemplary embodiment of one possible implementation of a transceiver front-end configured to process multiple signals. Other embodiments are possible. In an exemplary embodiment, the transceiver front end 402 comprises a transmit driver 404 configured to receive an information signal for transmission. The transmit driver provides the transmit signal to a power amplifier 406 for transmission through a first filter 416, a first switch 414, a diplexer 412 to an antenna 411.

A receive signal is received at the antenna 411, provided through the diplexer 412 to the first switch 414 and the second switch 415, depending on the frequency of the received signal. The first switch 414 and the second switch 415 can be controlled by a control signal provided by, for example, the data processor 310 (FIG. 3), or another control element. In the exemplary embodiment shown in FIG. 4, the first filter 416 provides transmit signal rejection and receive band filtering, and the second filter 417 provides receive band filtering. In a carrier aggregation communication methodology, the first filter 416 may be configured to process a communication signal having a first carrier at a first frequency and the second filter 417 may be configured to process a second carrier at a second frequency.

The transceiver front end 402 also comprises a first low noise amplifier (LNA) circuit 420 and a second LNA circuit 430. The first LNA circuit 420 comprises exemplary LNAs 420a, 420b, 420c and 420n, where the "n" designation refers to an integer number of LNAs, depending on the number of frequency bands. The second LNA circuit 430 comprises exemplary LNAs 430a, 430b, 430c and 430n, where the "n" designation refers to an integer number of LNAs, depending on the number of frequency bands. In the exemplary embodiment shown in FIG. 4, the first LNA circuit 420 can be configured to receive primary receive channels and the second LNA circuit 430 can be configured to receive secondary or diversity, receive channels. Although omitted for ease of illustration, the second LNA circuit 430 is also coupled to an antenna, diplexer, switches and filters, which may be the same or different from the antenna 411, diplexer 412, first switch 414, second switch 415, first filter 416 and second filter 417. In the exemplary embodiment shown in FIG. 4, the first LNA circuit 420 and the second LNA circuit 430 are configured to operate on a single-ended communication signal. In alternative exemplary embodiment, the first LNA circuit 420 and the second LNA circuit 430 can be configured to operate on a differential communication signal.

The first LNA circuit 420 is coupled to a transformer 425 and a transformer 426. In this exemplary embodiment, the transformer 425 can be configured to process a first carrier at a first frequency and provide an output CA1 and the transformer 426 can be configured to process a second carrier at a second frequency and provide an output CA2.

The second LNA circuit 430 is coupled to a transformer 427 and a transformer 428. In this exemplary embodiment, the transformer 427 can be configured to process the first carrier at the first frequency and provide the output CA1 and the transformer 428 can be configured to process the second carrier at the second frequency and provide an output CA2. In an exemplary embodiment, the transformers 425, 426, 427 and 428 provide single-ended to differential signal conversion such that the outputs CA1 and CA2 from the transformers 425, 426, 427 and 428 are differential signals.

The transceiver front end 402 also comprises a first downconverter circuit 440 and a second downconverter circuit 442. The first downconverter circuit 440 comprises mixers 436a and 436b, which receive a first local oscillator signal (LO1) from local oscillator signal generator 437. The second downconverter circuit 442 comprises mixers 438a and 438b, which receive a second local oscillator signal (LO2) from local oscillator signal generator 439. In an exemplary embodiment, the mixers 436a and 436b process the receive signal CA1 from transformer 425 and transformer 427, and the mixers 438a and 438b process the receive signal CA2 from transformer 426 and transformer 428.

The output of the mixer 436a is provided to an amplifier 444, the output of the mixer 436b is provided to an amplifier 446, the output of the mixer 438a is provided to an amplifier 447 and the output of the mixer 438b is provided to an amplifier 448. The respective outputs of the amplifiers 444, 446, 447 and 448 are then further processed by other components within a wireless device.

In an exemplary embodiment, the transceiver front end 402 also comprises a WIFI transmit driver 458 configured to receive a WIFI information signal for transmission. The WIFI transceiver can be located on the same chip as the cellular transceiver or on a different chip. If implemented on a different chip, it can be implemented on the same printed circuit board as the cellular transceiver. The WIFI transmit driver 458 provides the WIFI transmit signal to a power amplifier 456 for transmission through a third filter 454, and a switch or duplexer 452 to an antenna 451.

A WIFI receive signal is received at the antenna 451, provided through the switch or duplexer 452 to the filter 454 and then to an LNA 459. The output of the LNA 459 is provided to a transformer 461 for conversion to a differential signal, and then to a mixer 462 for downconversion. The LO for the mixer 462 is not shown. The output of the mixer 462 is provided to an amplifier 464. The output of the amplifiers 464 is then further processed by other components within a wireless device.

The arrow 453 represents transmit signal energy as an OOB transmit jammer that may overcome the filter 416 and enter the LNA 420a, proceed through the transformer 425, and then enter the mixer 436a, thus making downconversion and recovery of the desired signal 455 on CA1 difficult. Similarly, the arrow 466 represents WIFI transmit signal energy as an OOB WIFI jammer that may overcome the filter 417 and enter the LNA 420n, proceed through the transformer 426, and then enter the mixer 438a, thus making downconversion and recovery of the desired signal 467 on CA2 difficult.

Figure 5:
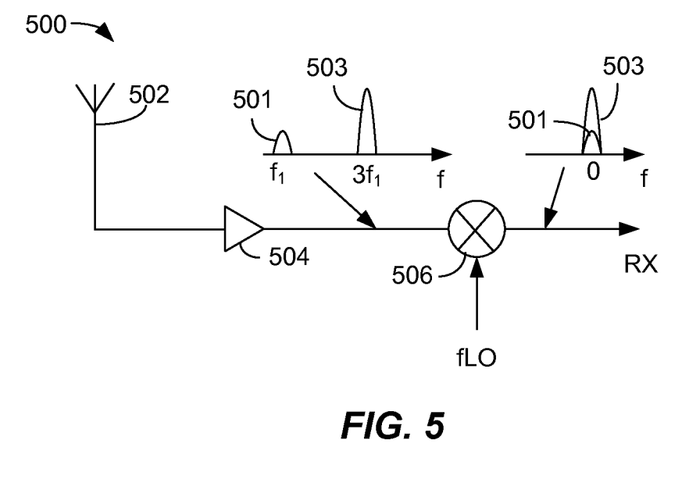
FIG. 5 is a graphical illustration showing the effect of a jammer signal on a desired signal after downconversion.

FIG. 5 is a graphical illustration showing the effect of a jammer signal on a desired signal after downconversion. A desired receive signal 501 and a jammer signal 503 are received at an antenna 502. In an exemplary embodiment, the desired receive signal 501 may occur at a frequency f1 and the jammer signal 503 may occur at a frequency of 3f1 or at an even higher order of the f1 frequency. The desired signal 501 and the jammer signal 503 are simultaneously downconverted by a mixer 506 using a local oscillator (LO) frequency of f1. The signal appearing at the output of the mixer 506 illustrates that the jammer signal 503 desensitizes the mixer 506 to a point at which the information in the desired signal 501 cannot be recovered.

Figure 6:
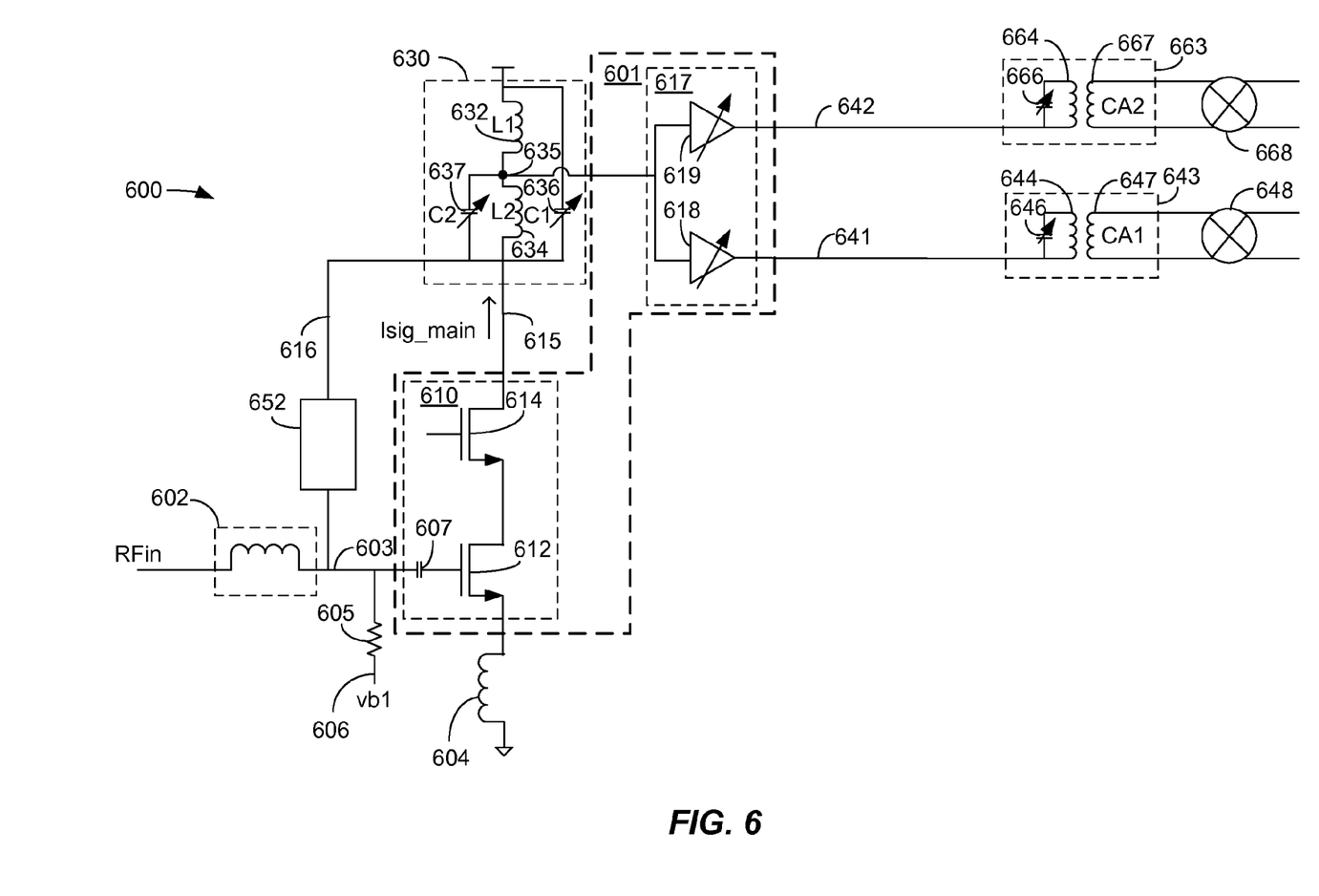
FIG. 6 is a schematic diagram illustrating an exemplary embodiment of a circuit having a two stage low noise amplifier (LNA) that can be used to filter high frequency jammer signals located at harmonic frequencies of the desired receive signal.

FIG. 6 is a schematic diagram illustrating an exemplary embodiment of a circuit 600 having a two stage low noise amplifier (LNA) 601 that can be used to filter high frequency jammer signals located at harmonic frequencies of the desired receive signal. The circuit 600 can also simultaneously improve the dual stage low noise amplifier out-of-band IIP2 and IIP3 performance. A single-ended radio frequency (RF) input signal is provided through a single-element matching circuit 602 to a first LNA stage 610. In an exemplary embodiment, the single-element matching circuit 602 may comprise a single inductor. The first LNA stage 610 comprises a transistor 612 and a transistor 614. In an exemplary embodiment, the transistor 612 operates as a gain transistor and the transistor 614 operates as a cascode transistor. The transistor 612 is biased by a signal, vb1, on connection 606 applied to its gate through a resistance 605 and a DC blocking capacitance 607. The single-ended RF input signal on connection 603 is provided to the gate of the transistor 612. The source of the transistor 612 is connected to a source degeneration inductance 604. The drain of the transistor 612 is coupled to the source of the transistor 614. The output of the first LNA stage 610 is provided from the drain of the transistor 614 to a load circuit 630 over connection 615. The current flowing in connection 615 can be referred to as "Isig_main." The load circuit 630 can be an inductive and capacitive circuit, and in an embodiment, comprises a center-tapped inductor structure to realize high-order high frequency jammer filtering.

In an exemplary embodiment, the load circuit 630 comprises a first inductor 632, a second inductor 634, a first adjustable capacitor 636 and a second adjustable capacitor 637. The first inductor 632 and the second inductor 634 are coupled in what is referred to as a "center tapped" configuration such that a node 635 is formed between the first inductor 632 and the second inductor 634. The term "center tapped" is not intended to imply that the first inductor 632 and the second inductor 634 necessarily have equal values of inductance. However, in an exemplary embodiment, the first inductor 632 and the second inductor 634 may or may not have the same inductance. The first adjustable capacitor 636 and the second adjustable capacitor 637 may be adjusted by a control signal provide by, for example, the data processor 310 of FIG. 3.

The exemplary embodiment shown in FIG. 6 includes a feedback circuit 652. The feedback circuit 652 can be a passive feedback circuit comprising one or more of resistances, inductances and capacitances, or can be an active feedback circuit comprising resistances, inductances, capacitances and gain devices. The feedback circuit 652 provides feedback to achieve a desired 50 ohm input impedance matching instead of using a multiple-element input matching network, for example, when using a single element external inductance 602 as an input matching circuit.

The LNA 601 also comprises a second LNA stage 617 comprising a highly-linear inverter 618 and a highly-linear inverter 619. In an exemplary embodiment, the highly-linear inverter 618 and a highly-linear inverter 619 can be referred to as inverting amplifiers, and the second LNA stage 617 can also be referred to as a dual mode inverter. In an exemplary embodiment, the LNA 601 can be configured to operate in a carrier-aggregation (CA) mode in which more than one radio frequency (RF) output signal is generated from the RF input signal, RF_in. In an exemplary embodiment, the LNA 601 is configured to provide a first carrier output, CA1 and a second carrier output, CA2. However, the LNA 601 can be configured to provide more than two carrier output signals. In an exemplary embodiment, the highly-linear inverter 618 can be configured to process a CA1 output signal and the highly-linear inverter 619 can be configured to process a CA2 output signal. The output of the highly-linear inverter 618 is provided over connection 641 to a first transformer 643. The output of the highly-linear inverter 619 is provided over connection 642 to a second transformer 663.

The first transformer 643 comprises a primary side 644 and a secondary side 647. A variable capacitance 646 is coupled across the primary side 644. A single-ended RF communication signal is provided to the primary side 644 of the transformer 643 and is converted to a differential output on the secondary side 647. The output of the transformer 643 is provided from the secondary side 647 as a differential RF signal to a mixer 648 for downconversion and further processing.

The second transformer 663 comprises a primary side 664 and a secondary side 667. A variable capacitance 666 is coupled across the primary side 664. A single-ended RF communication signal is provided to the primary side 664 of the transformer 663 and converted to a differential output on the secondary side 667. The output of the transformer 663 is provided from the secondary side 667 as a differential RF signal to a mixer 668 for downconversion and further processing.

In an exemplary embodiment, the first LNA stage 610 amplifies a communication signal provided over connection 603 and provides an amplified communication signal over connection 615 to the load circuit 630. In an exemplary embodiment, the load circuit 630 operates to create a notch filter response at a harmonic of the amplified communication signal. In an exemplary embodiment, the load circuit 630 operates to create a notch filter response at the third harmonic of the amplified communication signal. However, the load circuit 630 can operate to create a notch filter response at other harmonics of the amplified communication signal, such as, for example, at other odd or even harmonic frequencies of the amplified communication signal. In an exemplary embodiment, the load circuit 630 divides the amplified communication signal over connection 615 into a first portion and a second portion and provides an output to one or more amplification paths in the second LNA stage 617.

The load circuit 630 operates as a signal splitting circuit, where the node 635 between the first inductor 632 and the second inductor 634 operates similar to a voltage divider. Only the first portion of the amplified communication signal across the first inductor 632 is coupled to the second LNA stage 617. The second inductor 634 is re-used to resonate with the second adjustable capacitor 637 at the jammer frequency, which in an exemplary embodiment, is set at the higher order (e.g., $3^{rd}$ order in an exemplary embodiment) harmonic of the amplified communication signal on connection 615, to filter an OOB jammer, which improves the linearity of the dual stage low noise amplifier 601.

In an exemplary embodiment, the first adjustable capacitor 636 resonates with the combination of the first inductor 632 and the second inductor 634, where the resonant frequency is the desired frequency of the amplified communication signal on connection 615.

In an exemplary embodiment, the second adjustable capacitor 637 resonates with the second inductor 634 at a frequency that corresponds with the frequency of the OOB jammer, which in this exemplary embodiment, is the third harmonic of the amplified communication signal on connection 615, thereby creating a filter characteristic that has a high signal rejection, or "notch" at a frequency that coincides with the frequency of the third-order harmonic of the amplified communication signal on connection 615. In this manner, third-order harmonics of the amplified communication signal on connection 615 are first attenuated by the shunt resonant filter response of the first adjustable capacitor 636 and the combination of the first inductor 632 and the second inductor 634, and third-order harmonics are further attenuated by the series resonant filter resulting from the combination of the second inductor 634 and the second adjustable capacitor 637.

In an exemplary embodiment, the first adjustable capacitor 636 resonating with the first inductor 632 and the second inductor 634 at a frequency that corresponds with the frequency of the amplified communication signal on connection 615 also provides a feedback signal comprising the second portion of the amplified communication signal over connection 616 to the feedback circuit 652 to help the circuit 600 achieve the single-L matching provided by the single-element matching circuit 602. In this exemplary embodiment, the signal across the first inductor 632 and the second inductor 634 is fed back through the feedback circuit 652; however, only the signal across the first inductor 632 from the node 635 is sent to the input of the second LNA stage 617. This increases the voltage swing of the signal going to the feedback circuit 652, thus improving the noise figure of the first LNA stage 610, and simultaneously decreasing the voltage swing at node 635 before the amplified receive signal is sent to the second LNA stage 617. In an exemplary embodiment, the tank circuit 630 filters third-order jammer signals, and also improves the dual-stage low noise amplifier linearity, including IIP2 and IIP3 performance. The linearity improvement is obtained by using the center-tapped architecture of the first inductor 632 and the second inductor 634 such that only part of the voltage of the amplified communication signal on connection 615 is provided to the second LNA stage 617 via the node 635. This is preferred because the highly-linear inverters 618 and 619 operate most efficiently with a small input voltage. However, a larger voltage swing is preferred at connection 616 to provide feedback to the feedback circuit 652 to allow the single-L matching and to improve noise figure performance. In other exemplary embodiments, the signal across the first inductor 632 and the second inductor 634 can be fed back through the feedback circuit 652 in embodiments where other than single-L matching is used.

The center tapped configuration of the first inductor 632 and the second inductor 634 creates a node 635 from which the amplified communication signal can be provided to multiple amplification paths in the second LNA stage 617. Although two amplification paths are shown in the second LNA stage 617, more than two amplification paths can be included in the second LNA stage 617.

Figure 7:
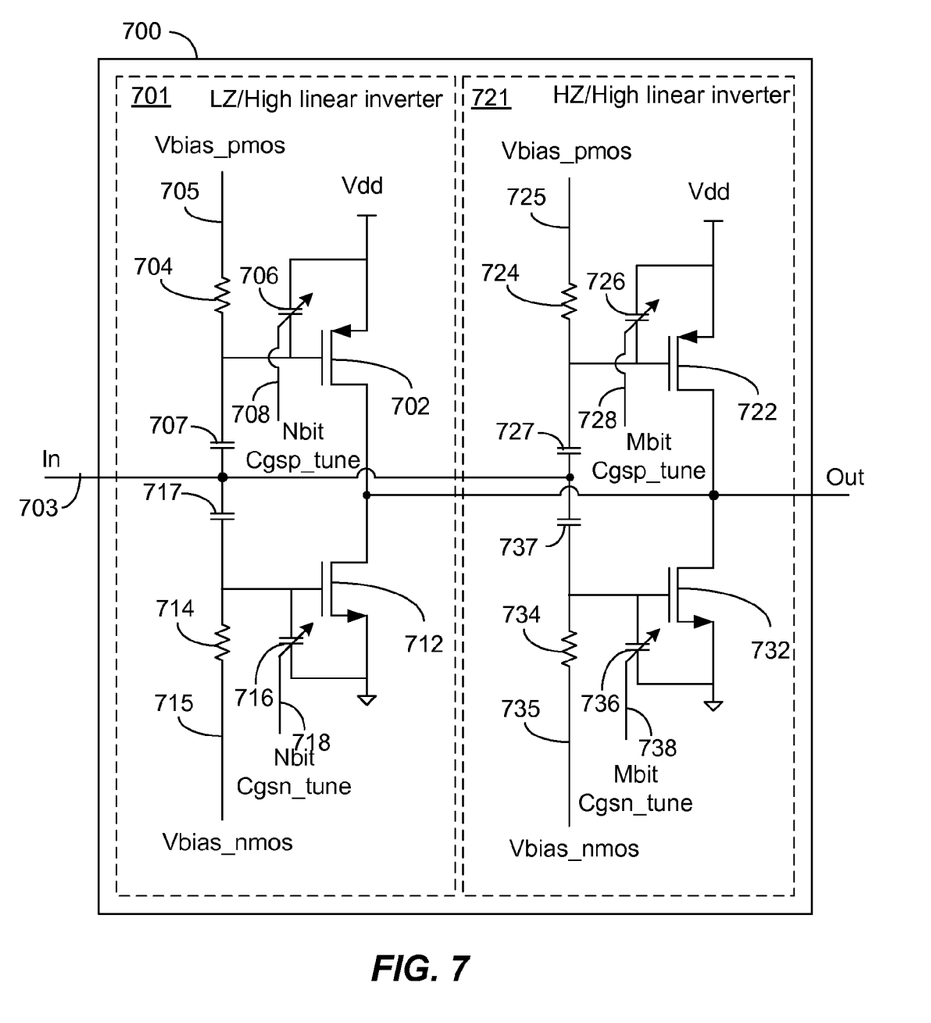
FIG. 7 is a schematic diagram illustrating an exemplary embodiment of a highly-linear inverter of FIG. 6.

FIG. 7 is a schematic diagram illustrating an exemplary embodiment of a highly-linear inverter of FIG. 6. The highly-linear inverter 700 comprises a low impedance (LZ) highly linear inverter section 701 and a high impedance (HZ) highly-linear inverter section 721.

The LZ highly-linear inverter section 701 comprises a PMOS transistor 702, an adjustable capacitance 706, a resistance 704 and a capacitance 707. The LZ highly linear inverter section 701 also comprises an NMOS transistor 712, an adjustable capacitance 716, a resistance 714 and a capacitance 717. A bias signal, Vbiaspmos is provided over connection 705 to the gate of the transistor 702 through the resistance 704. A bias signal, Vbias_nmos is provided over connection 715 to the gate of the transistor 712 through the resistance 714. In an exemplary embodiment, the adjustable capacitance 706 can be adjusted by an N bit gate-source tuning signal (Cgsp_tune), provided over connection 708 from the data processor 310. In an exemplary embodiment, the adjustable capacitance 716 can also be adjusted by the N bit gate-source tuning signal, (Cgsn_tune), provided over connection 718 from the data processor 310. The number of tunable capacitors (N) is determined by the gain variation the system uses to set different gain modes, which in an exemplary embodiment, can range from one to four, but in other exemplary embodiment may be other values.

The HZ highly linear inverter section 721 comprises a PMOS transistor 722, an adjustable capacitance 726, a resistance 724 and a capacitance 727. The HZ highly-linear inverter section 721 also comprises an NMOS transistor 732, an adjustable capacitance 736, a resistance 734 and a capacitance 737. A bias signal, Vbias_pmos is provided over connection 725 to the gate of the transistor 722 through the resistance 724. A bias signal, Vbias_nmos is provided over connection 735 to the gate of the transistor 732 through the resistance 734. In an exemplary embodiment, the adjustable capacitance 726 can be adjusted by an M bit gate-source tuning signal (Cgsp_tune), provided over connection 728 from the data processor 310. In an exemplary embodiment, the adjustable capacitance 736 can also be adjusted by the M bit gate-source tuning signal, (Cgsp_tune), provided over connection 738 from the data processor 310. The number of tunable capacitors (M) is determined by the gain variation the system uses to set different gain modes, which in an exemplary embodiment, can range from one to four, but in other exemplary embodiment may be other values.

The impedance difference between the LZ highly-linear inverter section 701 and the HZ highly-linear inverter section 721 is determined by the capacitances 707 and 717 in the LZ highly-linear inverter section 701 and the capacitances 727 and 737 in the HZ highly-linear inverter section 721.

At RF frequencies, the capacitances 707 and 717 behave like short circuits, thus providing a low impedance (LZ) path to AC-couple the input signal from connection 703 to the gates of the gain-amplifying transistors 702 and 712.

The capacitances 727 and 737 are relatively small compared to the capacitances 707 and 717, respectively, and at RF frequencies operate to "block" or attenuate the signal on connection 703 before the signal on connection 703 is applied to the gates of the gain-amplifying transistors 722 and 732. Only the LZ highly-linear inverter section 701 or the HZ highly-linear inverter section 721 is enabled at a particular time, depending on the desired gain variation. For example, the LZ highly-linear inverter section 701 may provide one or two dB of gain variation, while the HZ highly-linear inverter section 721 may provide 10 or more dB of gain variation.

The NMOS/PMOS configuration of the highly-linear inverter 700 provides intrinsic IM2 cancellation, so that the highly-linear inverters 618 and 619 do not add any appreciable IM2 products to the signal on connections 641 and 642 (FIG. 6).

Figure 8:
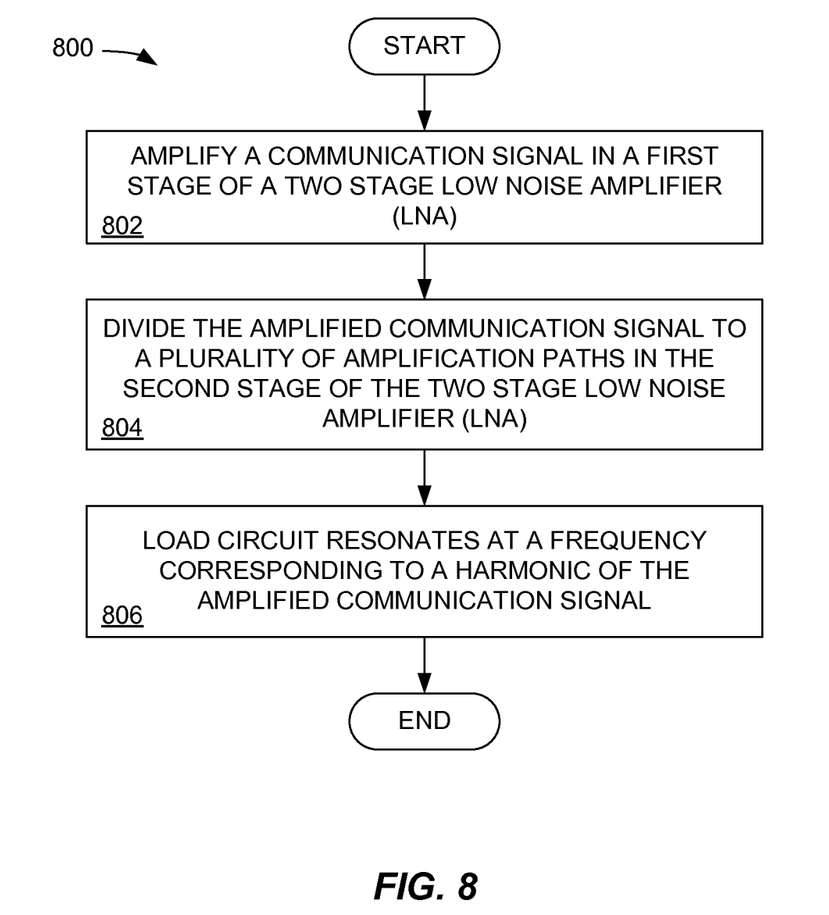
FIG. 8 is a flow chart describing the operation of an exemplary embodiment of a circuit having a two stage low noise amplifier (LNA) that can be used to provide harmonic rejection in the LNA.

FIG. 8 is a flow chart 800 describing the operation of an exemplary embodiment of a circuit having a two stage low noise amplifier (LNA) that can be used to cancel higher order distortion products in the LNA. The blocks in the flow chart 800 can be performed in or out of the order shown, and in some embodiments, can be performed at least in part in parallel.

In block 802, a communication signal is amplified in a first stage of a two stage low noise amplifier (LNA) having a first LNA stage and a second LNA stage. In block 804, the amplified communication signal is divided to a plurality of amplification paths in the second stage of the two-stage LNA.

In block 806, the load circuit resonates at a frequency corresponding to a harmonic of the amplified communication signal. In an exemplary embodiment, the load circuit resonates at a frequency corresponding to a third-order harmonic of the amplified communication signal; however, the load circuit may be configured to resonate at frequencies corresponding to other order harmonics.

The LNA circuit described herein may be implemented on one or more ICs, analog ICs, RFICs, mixed-signal ICs, ASICs, printed circuit boards (PCBs), electronic devices, etc. The LNA circuit may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the LNA circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A device, comprising:
a load circuit configured to receive an amplified communication signal, the load circuit having a center tapped inductor structure configured to divide the amplified communication signal into a first portion and a second portion, the load circuit configured to resonate at a harmonic of the amplified communication signal; and
a two-stage low noise amplifier (LNA) comprising a first LNA stage and a second LNA stage, the first LNA stage configured to generate the amplified communication signal to the load circuit, the load circuit configured to apply the first portion of the amplified communication signal to at least two amplifiers in the second LNA stage.

2. The device of claim 1, wherein the load circuit comprises a first inductor and a second inductor, a first adjustable capacitor and a second adjustable capacitor.

3. The device of claim 2, wherein the second inductor and the second adjustable capacitor are configured to create a notch filter response at the harmonic of the amplified communication signal.

4. The device of claim 2, wherein the first adjustable capacitor is configured to resonate with the first inductor and the second inductor at a desired receive frequency.

5. A device, comprising:
a load circuit comprising a first inductor, a second inductor, a first adjustable capacitor, and a second adjustable capacitor, the load circuit configured to receive an amplified communication signal, the load circuit having a center tapped inductor structure configured to divide the amplified communication signal into a first portion and a second portion, wherein the first adjustable capacitor is configured to resonate with the first inductor and the second inductor to develop a feedback signal, the feedback signal comprising the second portion of the amplified communication signal.

6. The device of claim 2, wherein the second inductor is configured to resonate with the second adjustable capacitor at a frequency corresponding to a third harmonic of the amplified communication signal.

7. The device of claim 6, wherein the second inductor configured to resonate with the second adjustable capacitor at a frequency corresponding to a third harmonic of the amplified communication signal is configured to cancel a third harmonic of the amplified communication signal.

8. A method, comprising:
amplifying a communication signal in a first stage of a two stage low noise amplifier (LNA);
dividing at a center tapped inductor structure of a load circuit the amplified communication signal into a first portion and a second portion;
providing the first portion to a plurality of amplification paths in a second stage of the two-stage LNA; and
resonating at a harmonic frequency of the amplified communication signal.

9. The method of claim 8, wherein the resonating creates a notch filter response at the harmonic of the amplified communication signal.

10. The method of claim 8, further comprising resonating at a frequency corresponding to a third harmonic of the amplified communication signal.

11. The method of claim 10, wherein resonating at a frequency corresponding to a third harmonic of the amplified communication signal cancels a third harmonic of the amplified communication signal.

12. A device, comprising:
- means for amplifying a communication signal in a first stage of a two stage low noise amplifier (LNA);
- means for dividing the amplified communication signal into a first portion and a second portion and for applying the first portion to a plurality of amplification paths in a second stage of the two-stage LNA; and
- means for resonating at a harmonic frequency of the amplified communication signal; and
- means for creating a notch filter response at the harmonic of the amplified communication signal.

13. The device of claim 12, further comprising means for resonating at a frequency corresponding to a third harmonic of the amplified communication signal.

14. The device of claim 13, further comprising means for canceling a third harmonic of the amplified communication signal.

15. The device of claim 12, wherein the means for dividing comprises a load circuit.

16. The device of claim 15, wherein the load circuit comprises a center tapped inductor structure.

* * * * *